United States Patent [19]

Kubinec

[11] 4,246,502
[45] Jan. 20, 1981

[54] MEANS FOR COUPLING INCOMPATIBLE SIGNALS TO AN INTEGRATED CIRCUIT AND FOR DERIVING OPERATING SUPPLY THEREFROM

[75] Inventor: James J. Kubinec, Tahoma, Calif.

[73] Assignee: Mitel Corporation, Canada

[21] Appl. No.: 933,984

[22] Filed: Aug. 16, 1978

[51] Int. Cl.³ .............. H01L 29/78; H03K 3/26; H03K 3/353
[52] U.S. Cl. ..................... 307/303; 307/304; 357/23; 357/59; 357/51; 357/13
[58] Field of Search ............ 357/23, 51, 59, 13; 307/303, 238, 304

[56] References Cited

U.S. PATENT DOCUMENTS

| | | | |
|---|---|---|---|
| 3,644,850 | 2/1972 | Ho ................................ | 357/51 |
| 3,789,246 | 1/1974 | Preisig et al. .................. | 357/23 |
| 3,836,992 | 9/1974 | Abbas et al. ................... | 357/59 |
| 3,979,734 | 9/1976 | Pricer et al. ................... | 357/51 |
| 4,110,839 | 8/1978 | Bert et al. ..................... | 357/59 |
| 4,112,509 | 9/1978 | Wall .............................. | 357/23 |
| 4,122,543 | 10/1978 | Bert et al. ..................... | 357/23 |
| 4,151,021 | 4/1979 | McElroy ........................ | 357/59 |
| 4,156,249 | 5/1979 | Koo .............................. | 357/23 |
| 4,163,242 | 7/1979 | Stein ............................. | 357/59 |

*Primary Examiner*—Andrew J. James
*Attorney, Agent, or Firm*—Craig & Antonelli

[57] ABSTRACT

An on-board integrated circuit chip signal source which allows operation of the chip from previously incompatible and excessively high amplitude signal sources, and as well powers the chip from such sources as the input signal, a clock, etc. The invention utilizes a 3 plate capacitor, with the bottom plate formed of a heavily doped region of the silicon substrate. Signal is applied between the outside plates of the capacitor and a proportion of the signal is received between the center plate and one of the outside plates. A diode clamp connected between the center plate and a reference potential fixes the derived peak and average signal levels.

19 Claims, 4 Drawing Figures

MEANS FOR COUPLING INCOMPATIBLE SIGNALS TO AN INTEGRATED CIRCUIT AND FOR DERIVING OPERATING SUPPLY THEREFROM

This invention relates to a structure for supplying signals to a semiconductor integrated circuit from an external source previously considered incompatible with the integrated circuit.

BACKGROUND OF THE INVENTION

Integrated circuits require carefully controlled input signal voltage amplitudes and power supply amplitudes for proper operation. For instance, if the input signal amplitude to a linear MOS integrated circuit is excessive, the circuit usually will saturate, or worse, forward biasing parasitic diodes, causing destructive currents. Power supply voltages must also be kept within given ranges, although they are usually less critical once the operating parameters of the circuit have been established.

Where an excessively high input signal voltage is present, it is necessary to reduce its amplitude by such means as a voltage divider. The voltage divider is most economical if it is integrated with the circuit into the semiconductor chip itself.

Integration of a voltage divider into a MOS chip, with isolation of the source has previously been provided using transistor voltage dividers, since transistors have traditionally been the easiest elements to fabricate. MOSFET transistors used in this manner typically have their gates short circuited to their drains, to form diodes. Since the diodes have predetermined threshold voltage drops, series arrays of such diodes can provide voltage division.

However, besides providing a voltage division, such diodes automatically set up bias levels at the divider output relative to the chip substrate potential due to their inherent threshold voltages. Consequently the amount of voltage division available as well as the relative positive and negative input signal amplitudes which can be accommodated before saturation is limited by the self biasing established as a result of the diode doping level, the number of series connected diodes, etc.

In the present invention, there are no diode threshold utilized to provide the voltage division, and consequently the self biasing offset is eliminated. Consequently there is not saturation point which is based on the number of diodes in series, and the designer is given substantially greater freedom in designing a given input voltage drop. Further, the design freedom now allows the integration of an on-board chip power supply in the semiconductor integrated circuit with which it is to operate.

– In the present invention, an integrated capacitor voltage divider is utilized. While one would otherwise expect threshold potentials to be present due to doping of the semiconductor substrate to form a capacitor plate, and thus to exhibit undesirable effects due to the presence of the diffused or implanted doped region within the substrate, the present structure is fabricated so that the resulting semiconductor surface is already heavily inverted even with no external bias potential applied. Accordingly additional potential applied to the doped region does not shift the operating point to a threshold region where threshold potentials would affect the stability of the output signal with changes in input signal.

The present invention provides for the on-board derivation of signal voltages which are substantially different in amplitude and with respect to external ground than that of the input voltage. Means is also provided for establishing an on-board power supply voltage of AC or DC form.

Further, the present invention provides means for deriving power supply voltages from hitherto unexpected or prviously unsuitable sources, such as an external clock source, which is particularly useful for use with CMOS integrated circuitry. In this application other power supply input leads may be dispensed with, assuming that the clock source can supply all power supply requirements.

Accordingly the present structure provides a substantially more flexible and improved means for supplying power to the integrated circuit, for supplying signals to the integrated circuit which are compatible therewith from hitherto incompatible sources, using circuitry which is integrated in the chip itself, while at the same time being of more economical form. Further, the structure can be fabricated in MOS circuitry using either metal gate, double polycrystalline layer technology or the like.

SUMMARY OF THE INVENTION

The invention in general is a semiconductor structure including a three plate capacitor comprising a lower relatively conductive region of heavily doped silicon, having a first insulating layer covering the conductive region. A polycrystalline silicon relatively conductive layer is located over the first insulating layer covering at least a substantial portion of the bottom conductive region. A second insulating layer covers the polycrystalline layer. An upper conductive layer is disposed over the second insulating layer, and conductive means contacts the polycrystalline layer for providing an output signal when an input signal is applied between the upper conductive layer and the lower conductive region.

DESCRIPTION OF THE DRAWINGS

A better understanding of the invention will be obtained by reference to the detailed description of the preferred and other embodiments below, in conjunction with the following drawings, in which.

DETAILED DESCRIPTION OF THE INVENTION

Figure 1:
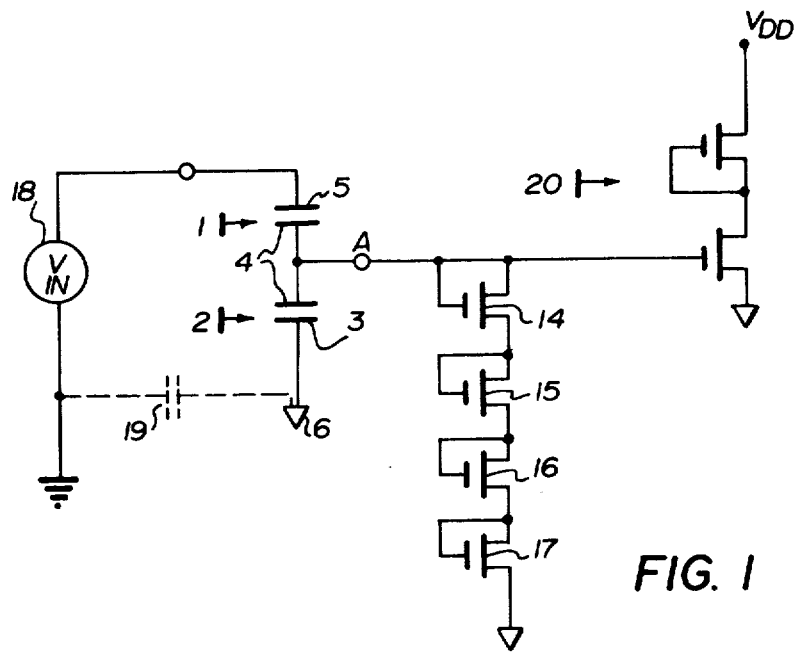
FIG. 1 is a schematic diagram of the invention, including circuit means for use with the invention.

Turning first to FIG. 1, a capacitor voltage divider comprising capacitors 1 and 2 is shown. While two capacitors are shown, it is preferred that the structure be fabricated as a single three plate capacitor. For example the capacitor preferably is fabricated of a bottom conductive plate 3, a single centre plate 4 which is insulated from bottom plate 3, and an upper conductive plate 5 which is insulated from centre plate 4. Contact may be made to the centre plate 4 at node A.

As is well known using capacitor voltage dividers, an external AC voltage applied between capacitor plates 5 and 3 is divided according to the inverse ratio of the capacitance of capacitor 2 to the series capacitance of capacitors 1 and 2. A reduced amplitude output signal may thus be obtained between node A and capacitor plate 3, contact to the latter which may be made at the chip substrate ground point 6.

While the concept of a capacitor voltage divider is not being claimed as being new, such a structure within an integrated circuit having a heavily inverted diffused area forming the bottom capacitor plate (which provides particular advantages) is believed unique, particularly when used in a structure described wherein.

Figure 4:
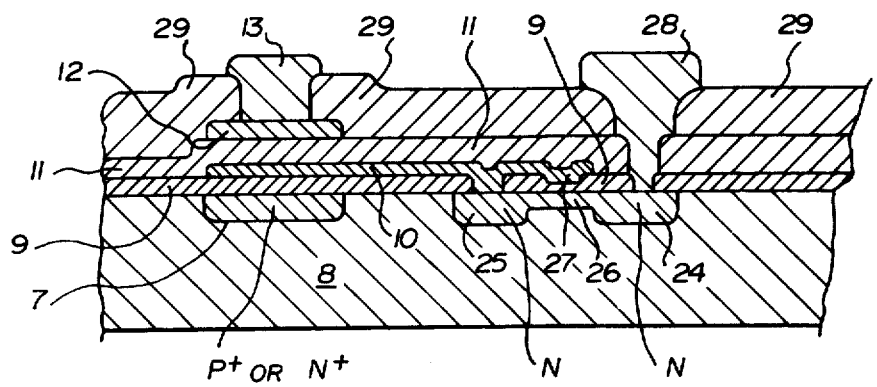
FIG. 4 is a cross-section of a physical embodiment of the invention including a portion of the circuit means.

Considering FIG. 1 in conjunction with FIG. 4, the bottom or lower plate 3 is fabricated as a heavily doped P+ or N+ region 7 within a P or N substrate 8. The P+ or N+ region may be diffused, or implanted by ionic bombardment of boron or phosphorus, etc. according to the particular process utilized. This region 7 forms the lower relatively conductive plate 3 of the 3-plate capacitor, and substrate 8 in FIG. 4 forms the ground point or plane 6 referred to in FIG. 1.

The heavily doped region 7 exhibits a highly inverted surface with no external bias required. Accordingly the operating point of the structure is substantially distant in voltage from the voltage threshold of the surface. As a result applied input voltages have been found to not cause the inversion of the doped substrate surface to become so biased that the threshold is encountered.

The lower capacitor dielectric is provided by an insulating layer 9, which preferably is silicon dioxide. The centre conductive plate 4 is preferably fabricated of polycrystalline silicon, shown as layer 10 disposed over insulating layer 9 in FIG. 4. It should of course be located over the lower plate formed by conductive region 7.

The dielectric for the upper capacitor 1 is an insulating layer 11 preferably formed of silicon dioxide. The upper plate 5 is formed of a conductive layer 12. The particular material used for this layer will depend on the type of MOS process used. For instance where the silicon or metal gate fabrication process is used, conductive layer 12 would be made of aluminum. However where the double polycrystalline silicon process is used, conductive layer 12 would be made of polycrystalline silicon. In the latter case, there may be, if required, an additional metallized conductor making contact thereto, which conductor is shown as reference 13 in FIG. 4.

Node A in FIG. 1 is a location for connection to the centre plate of the multiple capacitor. There is no exact counterpart to node A shown in FIG. 4, except that the centre plate polycrystalline layer 10 extends to the right to make contact with other circuitry which will be described further below.

A voltage reference establishing circuit is connected to node A (FIG. 1). In an MOS integrated circuit this preferably consists of a series of diodes fabricated of MOS transistors, such as four of such transistors, 14, 15, 16, and 17. Each has its gate connected to its drain electrode, and each successive one has its source electrode connected to the drain of the preceding one, except for transistor 17. The source of transistor 17 is connected to a reference source of potential. The reference source can be, if preferred, the chip substrate ground point 6 as noted earlier. The present embodiment will be described with the example of the reference source being at the ground point 6.

Operation of the circuit is as follows. A source of AC signal 18 is connected to the upper plate 5 of the 3 plate capacitor, the other pole of the source of supply 18 being connected for AC to the chip substrate ground point 6. A capacitor 19 in dashed line is shown as a means connected between external ground and the substrate point 16 for obtaining the AC coupling, but other means may be used. The external ground potential thus can vary widely from the ground potential of the chip substrate ground point 6.

While the 3 plate capacitor provides voltage division, the actual potential of node A relative to the ground point 6 is established by the total of the thresholds of the series of diodes formed by MOS transistors 14, 15, 16 and 17. These self-biased diodes form a clamp for node A relative to the ground point 6 (or other threshold potential, if capacitor plate 3 is connected thereto.) With the thresholds of the MOS transistors at, for example, 0.7 volts, the potential between node A and ground point 6 is thus held at $4 \times 0.7 = 2.8$ volts.

It has been found that relative to external ground, the average AC potential as measured across capacitors 1 and 2 shifts. Thus where a sine wave is the form of the input voltage, a sine wave is produced as the form of the output voltage due to the shift in average level, and distortion of the waveform is avoided, which distortion would otherwise be expected using a series of diodes as a clamp, with applied potential exceeding their threshold.

The output AC signal may then be applied to MOS circuitry 20 as might be required.

It was noted above that the source electrode of MOS transistor 17 can be connected to a DC reference potential point which is different from that at the chip substate ground point 6. This further modifies the average DC level of the AC signal applied to circuitry 20.

Figure 2:
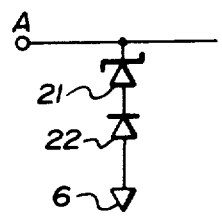
FIG. 2 is a schematic diagram of an alternative form of the circuit means.

An alternative structure for MOS transistors 14, 15, 16, and 17 is shown in FIG. 2. In this case the reference is provided by a zener diode 21 in series with an ordinary diode 22. The series of 2 diodes are connected between node A and the chip substrate ground point 6 (or to a reference potential if the design requires it).

As an example of the operation of this circuit, let us assume that the total series threshold voltage of zener diode 21 and ordinary diode 22 are 21 volts, the zener diode having a 20 volt threshold and the diode 22 having a 1 volt threshold. Accordingly the peak output voltage will be 21 volts.

Assume also that the values of capacitors 1 and 2 are equal. Accordingly, an input voltage of, for instance, 20 volts peak to peak is divided such that the voltage across each of the capacitors is 10 volts peak to peak. This would be the case notwithstanding that the external ground can be at a substantially different D.C. potential than the substrate ground.

With the peak voltage at node A at 21 volts relative to the ground point 6, and with one half the input voltage (10 volts peak to peak) available, the output voltage thus is an AC signal having a minimum voltage of 11 volts and a maximum voltage of 21 volts above the chip substrate ground point 6 potential.

It should thus be noted that the peak output voltage, for diodes formed of MOS transistors, is $nV_d$, where n is the number of diodes in series and $V_d$ is the threshold voltage of each of the diodes. The peak voltage is referenced to and is above either the substrate ground point or to a reference potential if desired.

Figure 3:
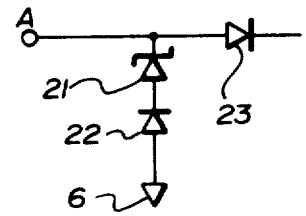
FIG. 3 is a schematic diagram of a further embodiment of the circuit means.

FIG. 3 shows the circuit of FIG. 2, with further means for providing a power supply for the integrated circuit. Diodes 21 and 22 are shown for example as the clamp connected to node A. A rectifier diode 23 is connected in series between node A and the utilization circuitry. An additional on-board capacitor can be used for filtering, or other circuitry which is well known to those skilled in the art.

It should be noted that the above described on-board power supply can be used to supply power to the chip either from an input signal or from a source such as a clock. If either of these inputs are used, one or both power supply leads can be eliminated from the chip, allowing the former power supply input terminal to be used for other purposes. The present circuit therefore provides an on-board power supply for an MOS integrated circuit chip, and particularly for a CMOS circuit, which is derived from an input signal or from a clock source.

Turning again to FIG. 4, an example of a single MOS clamping diode is shown for example purposes connected to the capacitor described above. The MOS diode is comprised of an MOS transistor having an N-doped source 24 and an N-doped drain 25 connected by an N-channel 26. Of course P type doping could be used to form a PMOS configuration.

A polysilicon gate 27 is located above the channel 26, insulated from the channel by silicon diode layer 9, in well known form. The polysilicon gate is connected directly to the drain 25, forming a short circuit, similar to transistor 14 in FIG. 1. The polysilicon gate is connected to the polycrystalline layer 10 which forms the centre plate of the 3-plate capacitor which is formed of capacitors 1 and 2.

A contact 28 is connected to source 24 in a well known manner. However rather than using contact 28, a polysilicon layer can be used to connect the source to the gate and drain of a further series MOS diode, in a manner similar to that first described between the centre plate of the 3 plate capacitor and the MOS diode. Contact 28 is thus shown for illustration purposes only.

Silicon dioxide layers 9 and 11 are shown insulating the just-described MOS structure in a well known manner. Field oxide 29 completes and protects the surface of the integrated circuit.

The present invention thus provides on-chip power supplies from external AC voltage sources without regard to the particular DC ground potential of the external supply, even in the presence of previously incompatible and excessive external supply potentials.

Other uses, other embodiments, and variations may now be conceived by persons skilled in the art understanding this invention. All are considered within this sphere and scope of the invention as defined in the appended claims.

I claim:

1. A semiconductor structure including a 3 plate capacitor comprising:
   (a) a lower relatively conductive region of heavily doped silicon,
   (b) a first insulating layer covering the conductive region,
   (c) a first polycrystalline relatively conductive layer disposed over the first insulating layer covering at least a substantial portion of the bottom conductive region,
   (d) a second insulating layer covering the polycrystalline layer,
   (e) an upper conductive layer disposed over the second insulating layer, and
   (f) conductive means contacting said polycrystalline layer for providing an output signal upon an input signal being a.c. coupled between the upper conductive layer and lower conductive region.

2. A semiconductor structure as defined in claims 1 in which the lower conductive region is a heavily doped P+ or N+ region in the surface of a silicon wafer.

3. A semiconductor structure as defined in claim 1 in which the lower conductive region is a heavily doped P+ or N+ region in the surface of an epitaxial layer carried by a silicon wafer.

4. A semiconductor structure as defined in claim 2, in which the material of the upper conductive layer is polycrystalline silicon.

5. A semiconductor structure as defined in claim 2 in which the material of the upper conductive layer is aluminum.

6. A semiconductor structure as defined in claim 2 in which the upper conductive layer is at least part of a contact pad for a wire bond.

7. A semiconductor structure as defined in claim 4 or 5 further comprising at least one voltage reference diode connected between said first polycrystalline layer and a source of reference potential.

8. A semiconductor structure as defined in claim 4 or 5 further comprising a zener diode connected in a series circuit between said first polycrystalline layer and a source of reference potential.

9. A semiconductor structure as defined in claim 4 or 5 further including a plurality of MOS transistors each having its gate short circuited to its drain, connected in series between the first polycrystalline layer and a source of reference potential.

10. A semiconductor structure as defined in claim 4 or 5 further including a plurality of MOS transistors each having its gate short circuited to its drain, connected in series between the first polycrystalline layer and the silicon wafer ground.

11. A semiconductor structure as defined in claim 4 or 5 further including a plurality of MOS transistors each having its gate short circuited to its drain, connected in series between the first polycrystalline layer and the lower conductive region of heavily doped silicon.

12. A semiconductor structure as defined in claim 4 or 5 further including a plurality of MOS transistors each having its gate short circuited to its drain, connected in series between the first polycrystalline layer and the silicon wafer ground, and means for connecting one terminal of a source of signal to the upper conductive layer, and for AC coupling the other terminal of the source of power to said lower conductive region.

13. A semiconductor structure as defined in claim 4 or 5 further including a plurality of MOS transistor each having its gate short circuited to its drain, connected in series between the first polycrystalline layer and the silicon wafer ground, and means for connecting one terminal of a source of clock signals to the upper conductive layer, and for AC coupling the other terminal of the source of clock signals to said lower conductive region.

14. A semiconductor integrated circuit structure comprising:
   (a) a plurality of interconnected CMOS transistors,
   (b) a power input bus to said transistors, (c) an input terminal for clock signals connected to predetermined ones of said transistors, (d) a pair of series connected capacitor means, one capacitor means having a bottom conductive region of heavily doped silicon, a first silicon dioxide insulating layer covering the conductive region, and an upper conductive layer over the insulating layer covering at least a substantial portion of the bottom conductive region, (e) the junction between the pair of capacitor means being connected through circuit means to the power input bus, (f) the input terminal for clock signals being connected to the other terminal of the other of the pair of capacitor means, whereby the clock source provides both clock signals and operating power for said transistors.

15. A semiconductor integrated circuit structure as defined in claim 14, in which the circuit means is comprised of a plurality of series connected MOS transistors each having its gate short circuited to its drain, connected between the junction of said capacitor means and a source of reference potential.

16. A semiconductor integrated circuit structure as defined in claim 15, in which the source of reference potential is the integrated circuit substrate.

17. A semiconductor integrated circuit structure as defined in claim 14, 15 or 16, in which the circuit means is comprised of a rectifier connected between the junction of the pair of capacitor means and the power input bus.

18. A semiconductor integrated circuit as defined in claim 14, 15 or 16, in which said upper conductive layer and the pair of capacitor means is fabricated of polycrystalline silicon, and further comprising a second silicon dioxide insulating layer covering said upper conductive layer, and a top conductive layer disposed over the second insulating layer covering at least a substantial portion of the upper conductive layer.

19. A semiconductor integrated circuit as defined in claim 14, 15 or 16, in which said upper conductive layer of the pair of capacitor means is fabricated of polycrystalline silicon, and further comprising a second silicon dioxide insulating layer covering at least a substantial portion of the upper conductive layer, and a top conductive capacitor plate comprising at least a portion of a wire bonding pad disposed over the second insulating layer.

* * * * *